United States Patent
Cheng et al.

(10) Patent No.: US 6,682,605 B2
(45) Date of Patent: Jan. 27, 2004

(54) APPARATUS AND METHOD FOR REMOVING COATING LAYERS FROM ALIGNMENT MARKS

(75) Inventors: Aaron Cheng, Hsinchu (TW);
Ting-Chun Wang, Taoyuan (TW);
Yu-Ku Lin, Hsin-Chu (TW);
Chun-Chang Chen, Miao-Li (TW);
Yi-Lang Wang, Tai-Chung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 179 days.

(21) Appl. No.: 10/043,017

(22) Filed: Jan. 7, 2002

(65) Prior Publication Data

US 2003/0127107 A1 Jul. 10, 2003

(51) Int. Cl.$^7$ .................................................. B08B 3/02
(52) U.S. Cl. ................................ 134/3; 134/6; 134/18; 134/24; 134/26; 134/28; 134/29; 134/32; 134/33; 134/34; 134/41; 134/42; 134/147; 134/148; 134/153; 134/902
(58) Field of Search ............................ 134/3, 6, 18, 24, 134/26, 28, 29, 33, 32, 34, 41, 42, 902, 147, 148, 153

(56) References Cited

U.S. PATENT DOCUMENTS

| | | | |
|---|---|---|---|
| 5,160,957 A | * | 11/1992 | Ina et al. ........................ 355/43 |
| 5,656,229 A | * | 8/1997 | Tanimoto et al. ............ 264/400 |
| 6,288,773 B2 | * | 9/2001 | Johnson et al. ................ 355/77 |
| 2001/0001571 A1 | * | 5/2001 | Johnson et al. ................ 355/77 |
| 2003/0116535 A1 | * | 6/2003 | Tsai et al. ...................... 216/83 |
| 2003/0127107 A1 | * | 7/2003 | Cheng et al. .................... 134/3 |

\* cited by examiner

*Primary Examiner*—Sharidan Carrillo
(74) *Attorney, Agent, or Firm*—Tung & Associates

(57) ABSTRACT

An apparatus and a method for removing coating layers from the top of alignment marks on a wafer are described. The apparatus includes a cleaning chamber that is a cavity and a lid member suspended in the cavity, a wafer chuck that is rotatably mounted in the lid member for holding a wafer in an upside down position such that the alignment marks are facing downwardly, and at least two solvent dispensing arms mounted in an outer peripheral area of the lid member that are immediately adjacent to the chuck for dispensing a flow of solvent upwardly toward the active surface of the wafer when the wafer is held in a stationary position, each of the at least two solvent dispensing arms are positioned corresponding to a position of one of the alignment marks.

6 Claims, 3 Drawing Sheets

APPARATUS AND METHOD FOR REMOVING COATING LAYERS FROM ALIGNMENT MARKS

FIELD OF THE INVENTION

The present invention generally relates to an apparatus and a method for removing coating layers from alignment marks on a wafer and more particularly, relates to an apparatus and a method for removing coating layers from the alignment marks by mounting two additional solvent dispensing nozzles in an edge bevel removal (EBR) chamber for spraying a solvent on the coating layers while the wafer is held in a stationary position.

BACKGROUND OF THE INVENTION

Deposition and patterning are two of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes. This is shown in FIG. 2, where the semiconductor wafer 202 has alignment marks, such as the alignment square 204, thereon. When the photomask 206 is positioned over the wafer 202, its own alignment marks, such as the alignment square 208, is aligned with the alignment marks of the wafer 202. For example, the alignment square 208 of the photomask 206 is aligned so that the alignment square 204 of the wafer 202 is centered therein.

Alignment is especially critical where more a number of metal or other layers have already been deposited on the wafer. Subsequent deposition of silicon dioxide or other layers in such instances usually requires that the alignment marks on the wafer be exposed for proper overlay of the silicon dioxide or other layers. While a mask may prevent the layers themselves from obfuscating the alignment marks, the photoresist used to pattern or perform other processing of these layers cannot be masked, and covers or at least blurs the alignment marks. Without clear exposure of the alignment marks, however, overlay misalignment can result. Overlay misalignment is also referred to as overlay registration error. Misalignment is a serious problem, and can result in significant semiconductor wafer scrap. Wafer scrap can sometimes be reused, but often is discarded, resulting in added costs incurred by the semiconductor foundry.

In the recent development of semiconductor fabrication technologies, copper has been widely used in devices of 0.18 $\mu$m or smaller as vias or interconnects. A widely used technique for depositing copper on a semiconductor wafer is the electrochemical plating method. However, when copper is deposited onto a wafer surface by the electrochemical plating method, alignment marks on the wafer are also covered with a layer of copper and a layer of TaN which is used as a diffusion barrier for copper. If the Cu/TaN layers over the alignment marks are not completely removed in a later process, alignment failure occurs in a future photolithographic step.

Presently, a process of edge bevel removal (EBR) is used to remove a circular band of Cu/TaN at the wafer edge. This is shown in FIG. 3. Wafer 302, which has alignment marks 304 and 306 formed on an active surface 308, is cleaned by using a cleaning solution such that a circular band 310 of Cu/TaN at the wafer edge is removed. Although the Cu/TaN layers over the alignment marks 304,306 is removed, the cleaning procedure inevitably results in die loss along the circular band 310. For instance, as shown in FIG. 3, the IC dies 312~330 are all lost due to the EBR process.

A typical electrochemical plating (ECP) apparatus 400 which includes an edge bevel removal (EBR) chamber 402 is shown in FIG. 4. The EBR chamber is arranged in a stacked bevel clean and spin rinse/dry chambers for convenient wafer transfer and space saving. The electrochemical plating apparatus 400 further includes two loadlock chambers 404,406 for loading/unloading unprocessed/processed wafers into and out of the apparatus 400. Wafer transfer stations 408 and 410 are used to transfer wafers between the loadlock chambers 404,406, the EBR chambers 402 and the anneal chambers 412 and 414. Within the apparatus 400, is a dual-blade robot 416 used to transfer wafers between the process stations 418, 420 each having a dual cell arrangement for conducting the electro-chemical plating operation. As previously shown in FIG. 3, while the EBR chamber 402 is able to remove coating layers from the top of alignment marks 304,306, the excessive number of IC dies that are lost due to the edge bevel removal process cannot be tolerated if a high fabrication yield is desired.

It is therefore an object of the present invention to provide an apparatus for removing coating layers from alignment marks that does not have the drawbacks or the shortcomings of the conventional apparatus.

It is another object of the present invention to provide an apparatus for removing coating layers from alignment marks on a wafer in an edge bevel removal chamber of a plating apparatus.

It is a further object of the present invention to provide an apparatus for removing coating layers from the top of alignment marks by installing at least two solvent spray nozzles in an edge bevel removal chamber for removing the coating layers while the wafer is held in a stationary position.

It is another further object of the present invention to provide an apparatus for removing coating layers from the top of alignment marks on a wafer by first spraying a solvent on the alignment marks while the wafer is stationary and then spraying solvent on the edge bevel while the wafer is rotated.

It is still another object of the present invention to provide an apparatus for removing coating layers from the top of alignment marks by spraying a $H_2SO_4$-containing solvent on the coating layers while the wafer is held in a stationary position.

It is yet another object of the present invention to provide a method for removing coating layers from the top of alignment marks on a wafer in a wafer edge cleaning chamber of an electrochemical plating apparatus.

SUMMARY OF THE INVENTION

In accordance with the present invention, an apparatus and a method for removing coating layers from the top of alignment marks in a wafer edge bevel removal chamber are disclosed.

In a preferred embodiment, a wafer edge bevel removal chamber for cleaning wafer edge alignment marks is provided which includes a cleaning chamber that has a cavity therein and a lid member suspended in the cavity; a wafer chuck rotatably mounted in the lid member for holding a wafer with an active surface of the wafer and at least two alignment marks on the active surface in a faced-down position; and at least two solvent dispensing arms mounted in an outer peripheral area of the lid member adjacent to the chuck for dispensing a flow of solvent upwardly toward the active surface of the wafer when the wafer is held in a stationary position, each of the at least two solvent dispensing arms are positioned corresponding to a position of one of the alignment marks.

In the wafer edge bevel removal chamber for cleaning wafer edge alignment marks, the EBR chamber is part of an electro-chemical plating (ECP) apparatus. The chamber may further include at least one solvent dispensing arm for dispensing a flow of solvent onto the active surface of the wafer for removing an edge bevel area when the wafer is rotated by the wafer chuck. The flow of solvent may be an $H_2SO_4$-containing solvent. The flow of solvent may include $H_2SO_4$, $H_2O_2$ and deionized water. The ECP apparatus may further include a wafer orientor for mounting the wafer on the wafer chuck in such a way that the alignment marks are at predetermined positions. The alignment marks may be coated with a copper layer. The at least two solvent dispensing arms are mounted such that solvent dispensing nozzles spray a solvent onto the alignment marks at a distance of about 6 mm from a wafer edge.

The present invention is further direct to a method for removing a coating layer on an alignment mark on a wafer in a wafer edge cleaning chamber which can be carried out by the operating steps of first providing a cleaning chamber that has a cavity therein and a lid member suspended in the cavity; providing a wafer chuck rotatably mounted in the lid member for holding a wafer with an active surface of the wafer and at least two alignment marks on the active surface in a faced-down position; mounting at least two solvent dispensing arms in an outer peripheral area of the lid member immediately adjacent to the chuck; and dispensing a flow of solvent upwardly toward the active surface of the wafer when the wafer is held in a stationary position, each of the at least two solvent dispensing arms is positioned corresponding to a position of one of the alignment marks.

The method for removing a coating layer on an alignment mark on a wafer may further include the step of dispensing a flow of solvent onto the active surface of the wafer and removing an edge bevel area when the wafer is rotated by the wafer chuck after the alignment mark cleaning step. The method may further include the step of dispensing a $H_2SO_4$-containing solvent onto the alignment marks, or the step of dispensing a solvent including $H_2SO_4$, $H_2O_2$ and deionized water onto the alignment marks. The method may further include the step of pre-orienting the wafer in an orientation chamber prior to the step of removing coating layers, or the step of removing a copper layer from the alignment marks, or the step of removing copper/tantalum nitride layers from the alignment marks.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for removing coating layers from the top of alignment marks situated on a wafer.

The method may be carried out in an improved edge bevel removal chamber of an electrochemical plating apparatus. The improvement is achieved by installing at least two solvent dispensing arms with spray nozzles on an outer peripheral area of a lid member immediately adjacent to a wafer chuck for dispensing a flow of solvent upwardly toward the alignment marks on the wafer, while the wafer is held in a stationary position. Each of the at least two solvent dispensing arms is positioned corresponding to a position of one of the alignment marks.

Figure 1A:
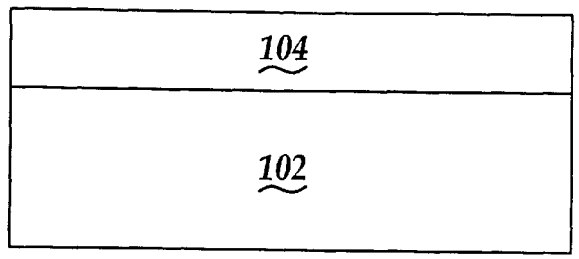
FIGS. 1A and 1B are enlarged, cross-sectional views showing the effect of patterning on a layer deposited on a semiconductor wafer.
Figure 1B:
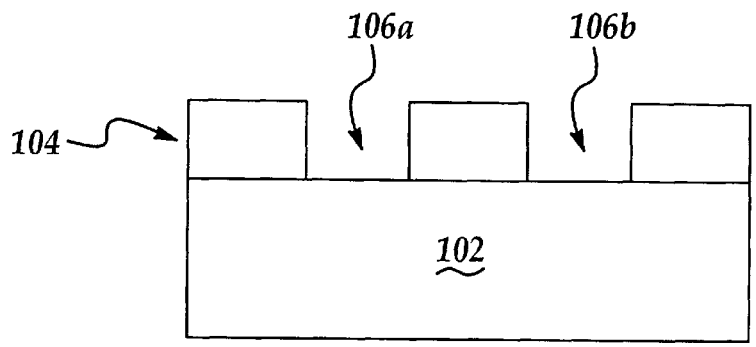
Figure 2:
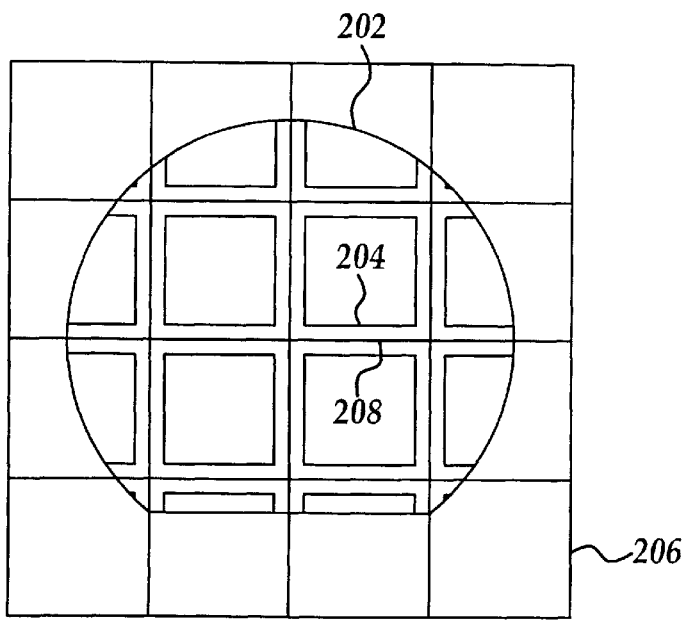
FIG. 2 is an enlarged, cross-sectional view showing the alignment of a mask to a semiconductor wafer.
Figure 3:
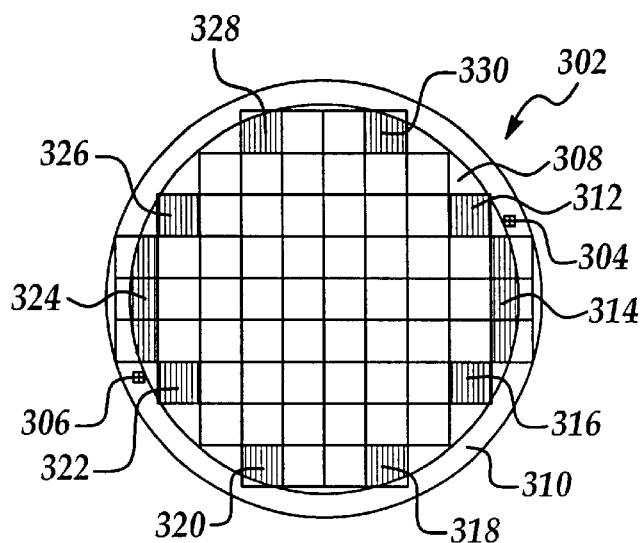
FIG. 3 is a plane view of a wafer that has alignment marks on top cleaned by a conventional cleaning method of edge bevel removal.
Figure 4:
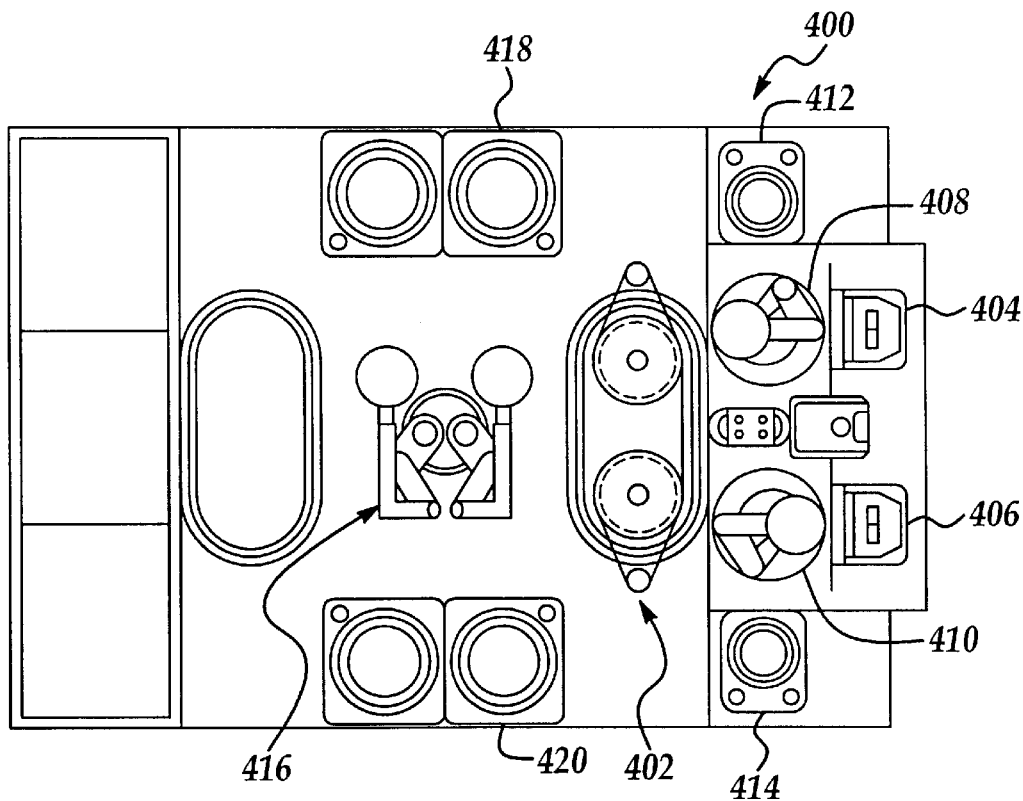
FIG. 4 is a plane view of a conventional electro-chemical plating apparatus including an edge bevel removal chamber.
Figure 5:
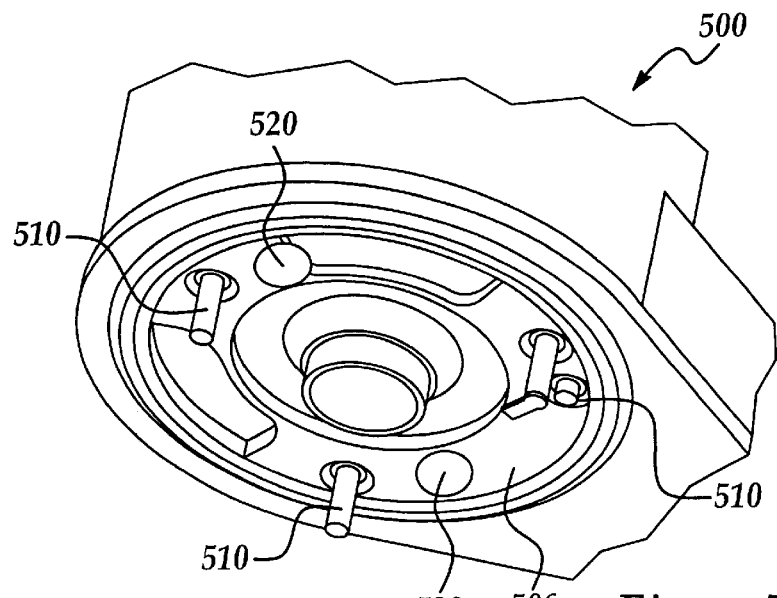
FIG. 5 is a perspective view of a lid member from the bottom of the present invention apparatus.
Figure 5A:
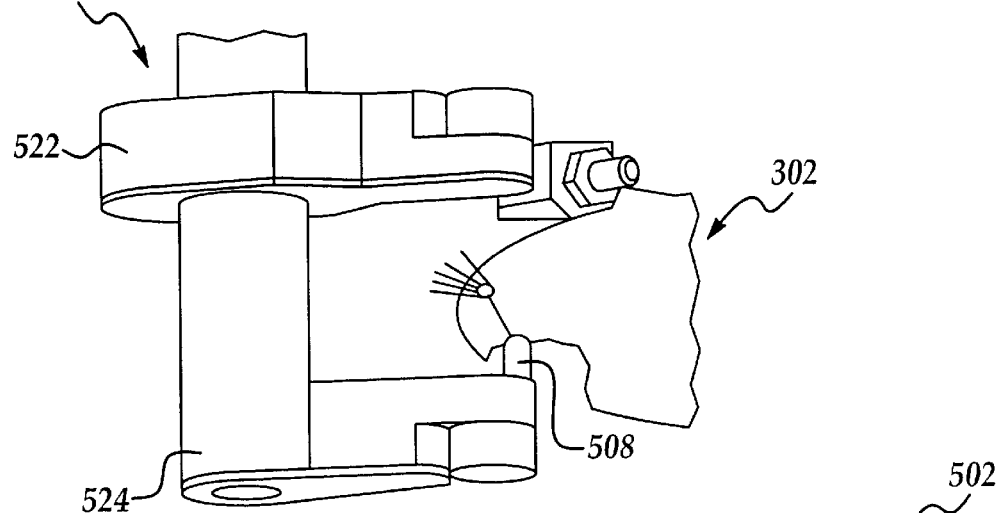
FIG. 5A is an enlarged, perspective view of the present invention solvent dispensing arm for removing coating layers on top of alignment marks.
Figure 5B:
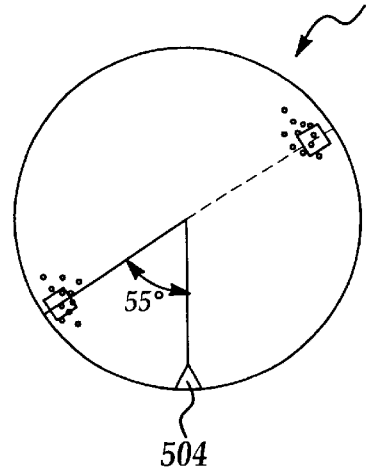
FIG. 5B is a plane view of a wafer illustrating the positions of the alignment marks in relation to the wafer orientation notch.

On a wafer 502, as shown in FIG. 5B, equipped with an orientation notch 504, the two alignment marks are situated at near the wafer edge at positions of 55° and 235° measured from the notch 504.

The alignment mark copper residue issue caused by a large step height in WCW (wide clear window) is a major problem in the copper processing technology. Wafers that have alignment mark copper residue on top cannot be further processed due to alignment failure in future photolithographic processes. The invention provides a new solvent dispensing means in an EBR chamber in the electrochemical plating apparatus for cleaning the copper residue remaining on the alignment marks. The newly provided solvent dispensing arms supply diluted $H_2SO_4$ solution to clean the copper coating layer remaining on the alignment marks of a wafer. The new EBR solvent dispensing arm and the cleaning method enable a thorough cleaning of copper residue on top of alignment marks and thus, eliminating problems that may be caused by such coating layer residue.

The present invention further utilizes a wafer orientor in an electrochemical plating apparatus such that the positions of the solvent dispensing arms can be matched to the positions of the wafer alignment marks. This enables copper residues on top of alignment marks to be removed thoroughly. Any potential scrap of wafers due to alignment failure in photolithographic process can thus be avoided.

Even though a copper chemical mechanical polishing process follows a copper plating process, the chemical mechanical polishing step cannot effectively remove the copper coating layer from the top of alignment marks.

A perspective, bottom view of a lid member 500 of the present invention edge bevel removal (EBR) chamber (not shown) is illustrated in FIG. 5, while an enlarged, perspective view of a solvent dispensing arm 520 of the present invention is shown in FIG. 5A. As shown in FIG. 5, three solvent dispensing arms 510 are utilized for cleaning the edge bevel on the wafer (not shown) after an electrochemical plating process is conducted for plating copper. The edge bevel cleaning process is conducted while the wafer is being rotated at a suitable rotational speed, such as between about 500 rpm and about 800 rpm.

The present invention solvent dispensing arms 520 are added to the bottom surface 506 of the lid member 500 at positions such that a flow of solvent can be injected toward a wafer surface at about 6 mm from the wafer edge. The spray of solvent by the present invention solvent dispensing arms 520 is significantly more toward the center of the wafer when compared to the solvent dispensing arms 510 that are used to spray solvent for edge bevel removal while the wafer is rotated. The stationary nature of the wafer allows the present invention solvent dispensing arms 520 to be aimed at a larger depth measured from the wafer edge such that coating layers, such as copper or copper/TaN, can be completely removed from the top of the two alignment marks, shown in FIG. 5B. Since the wafers are pre-oriented in the orientor by the orientation notch 504, the precise location of the alignment marks can be found by using the present invention novel method and apparatus.

As shown in FIG. 5A, the wafer 302 is rotated at a position over the solvent dispensing arm 520, while solvent is sprayed from the dispensing nozzle 508 onto the coating layers on the alignment marks. It must be noted that during the alignment mark cleaning process, the wafer is not rotated, as shown in FIG. 5A, which is only required during an edge bevel removal process that is later conducted. The present invention solvent dispensing arm 520 is constructed by an upper arm member 522 and a lower arm member 524. In-between the upper arm 522 and the lower arm 524, is provided a space having sufficient clearance for the rotation of a wafer 302.

The present invention novel solvent dispensing arm can be used to supply a cleaning solvent onto an active surface of a wafer at any desired area of the wafer. With the novel dispensing arm, any coating layer residue of Cu or TaN on top of the alignment marks can be completely removed.

A solvent that can be effectively used in removing Cu or Cu/TaN layers is one that contains $H_2SO_4$ diluted solution. For instance, a solvent mixture used in the present invention preferred embodiment is one that contains 1% $H_2SO_4$, 20% $H_2O_2$ and 79% deionized water. The solvent mixture is effective in etching away copper layers or copper/TaN layers from the wafer surface when the wafer is kept stationary such that a flow of solvent can be aimed at the alignment marks at 55° and 235° measured from the orientation notch.

The present invention novel cleaning process can be carried out by the following operating steps:

Step 1. Cleaning copper residue on top of alignment marks by the present invention novel dispensing arm and nozzle using the diluted acid solvent mixture. This is carried out while the wafer remains stationary.

Step 2. Cleaning edge bevel formed of copper from a wafer surface by using a conventional solvent dispensing arm, while aiming a flow of solvent on the edge of the wafer in a band of about 2~3 mm measured from the wafer edge. The same solvent mixture may be used to remove the edge bevel formed of Cu or Cu/TaN. During the Step 2 process, the wafer is rotated at a suitable rotational speed between about 500 rpm and about 800 rpm.

Step 3. Cleaning the wafer surface by spraying deionized water onto the wafer surface by a cleaning solution spray nozzle for a length of time that is suitable to remove all residual solvent mixture from the wafer surface.

The present invention novel apparatus and method for removing coating layers from the top of alignment marks on a wafer have therefore been amply described in the above description and in the appended drawings of FIGS. 5~5B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for removing a coating layer on an alignment mark on a wafer in a wafer edge cleaning chamber comprising the steps of:

providing a wafer having an active surface comprising at least two alignment marks, wherein a coating layer is present on each of said at least two alignment marks;

providing a cleaning chamber having a cavity therein and a lid member suspended in said cavity;

providing a wafer chuck rotatably mounted in said lid member for holding said wafer with said active surface in a faced-down position;

positioning the wafer on said wafer chuck such that the wafer chuck holds the wafer with the coating layer and said at least two alignment marks on said active surface in a faced-down position;

mounting at least two solvent dispensing arms in an outer peripheral area of said lid member juxtaposed to said wafer chuck; and removing said coating layer from each of said at least two alignment marks of the wafer by spraying a flow of solvent from said at least two solvent dispensing arms upwardly towards said active surface of the wafer when the wafer is held in a stationary position by the wafer chuck, each of said at least two solvent dispending arms being positioned corresponding to a position of each of said at least two alignment marks.

2. A method for removing a coating layer on an alignment mark on a wafer in a wafer edge cleaning chamber according to claim 1 further comprising the step of dispensing said flow of solvent onto said active surface of the wafer and removing an edge bevel area while said wafer is rotated by said wafer chuck after said coating layer on each of said at least two alignment marks is removed.

3. A method for removing a coating layer on an alignment mark on a wafer in a wafer edge cleaning chamber according to claim 1 wherein said flow of solvent further comprises a $H_2SO_4$-containing solvent.

4. A method for removing a coating layer on an alignment mark on a wafer in a wafer edge cleaning chamber according to claim 1 wherein said flow of solvent further comprises $H_2SO_4$, $H_2O_2$ and deionized water.

5. A method for removing a coating layer on an alignment mark on a wafer in a wafer edge cleaning chamber according to claim 1 further comprising the step of pre-orienting said wafer in an orientation chamber prior to said step of removing said coating layer.

6. A method for removing a coating layer on an alignment mark on a wafer in a wafer edge cleaning chamber according to claim 1 wherein said coating layer is a Cu layer.

* * * * *